(12) United States Patent
Gerber

(10) Patent No.: US 6,379,800 B1
(45) Date of Patent: Apr. 30, 2002

(54) GLYOXAL-PHENOLIC CONDENSATES WITH ENHANCED FLUORESCENCE

(75) Inventor: Arthur H. Gerber, Louisville, KY (US)

(73) Assignee: Borden Chemical, Inc., Columbus, OH (US)

( * ) Notice: Subject to any disclaimer, the term of this patent is extended or adjusted under 35 U.S.C. 154(b) by 0 days.

(21) Appl. No.: 09/765,819

(22) Filed: Jan. 20, 2001

Related U.S. Application Data

(63) Continuation-in-part of application No. 09/599,633, filed on Jun. 22, 2000, now abandoned, and a continuation-in-part of application No. 09/587,608, filed on Jun. 5, 2000, now abandoned.

(51) Int. Cl.$^7$ .................. B32B 27/38; B32B 27/12; C08L 61/06; C08G 8/04; C08F 6/00
(52) U.S. Cl. ............. 428/413; 428/311.11; 428/297.4; 525/134; 525/135; 525/154; 525/155; 528/129; 528/245; 528/501; 528/502 R; 528/503
(58) Field of Search .................. 428/413, 311.11, 428/297.4; 525/134, 135, 154, 155; 528/129, 245, 501, 502 R, 503

(56) References Cited

U.S. PATENT DOCUMENTS

| | | | |
|---|---|---|---|
| 4,501,787 A | 2/1985 | Marchetti | 428/236 |
| 4,604,317 A | 8/1986 | Berman et al. | 428/285 |
| 4,895,755 A | 1/1990 | Berman et al. | 428/290 |
| 5,012,016 A | 4/1991 | Li | 568/720 |
| 5,089,589 A | 2/1992 | Hesse et al. | 528/129 |
| 5,107,036 A | 4/1992 | Nakajima et al. | 568/727 |
| 5,146,006 A | 9/1992 | Li | 568/720 |
| 5,185,388 A | 2/1993 | Murata et al. | 523/466 |
| 5,191,128 A | 3/1993 | Li | 568/720 |
| 5,252,687 A | 10/1993 | Shiomi et al. | 525/502 |
| 5,407,779 A | 4/1995 | Uetani et al. | 430/192 |
| 5,429,904 A | 7/1995 | Nagase et al. | 430/192 |
| 5,478,871 A | 12/1995 | Takebe et al. | 523/4 |
| 6,001,950 A | 12/1999 | Gerber | 528/129 |
| 6,140,421 A | 10/2000 | Gerber | 525/134 |
| 6,239,248 B1 * | 5/2001 | Gerber | 428/311.11 |

FOREIGN PATENT DOCUMENTS

| | | |
|---|---|---|
| DE | 2 305 254 | 2/1973 |
| EP | 77758 A1 | 4/1983 |
| EP | 396203 A2 | 11/1990 |
| EP | 775591 | 5/1997 |
| GB | 1 544 249 | 2/1979 |
| JP | 56-159219 | 12/1981 |

OTHER PUBLICATIONS

Example 5A and the Product Produced Therefrom as Set Foth on pp. 28 and 29 of of U.S. of the Paren Case Ser. No. 09/158,584 of Sep. 22, 1998 is prior art due to Manufacture, Useus.

U.S. Patent Appln. S. N. 09/298,153; filed on Apr. 23, 1999 with A. H. Gerber as inventor.

U.S. Patent Appln. S. N. 09/421,641; Filed on Oct. 20, 1999; with A. H. Gerber as inventor.

\* cited by examiner

*Primary Examiner*—Robert Dawson
*Assistant Examiner*—Michael J. Feely
(74) *Attorney, Agent, or Firm*—George P. Maskas; Kenneth P. Van Wyck

(57) ABSTRACT

Glyoxal-phenolic condensates, epoxidized products thereof, as well as their method of manufacture are disclosed. The condensates and epoxidized products have exceptionally high fluorescence as well as good ultraviolet absorbance. There is also disclosed compositions and laminates containing the condensates and epoxidized products thereof.

23 Claims, No Drawings

GLYOXAL-PHENOLIC CONDENSATES WITH ENHANCED FLUORESCENCE

This application is a continuation-in-part of U.S. Ser. No. 09/587,608, filed on Jun. 5, 2000 and abandoned on Aug. 20, 2001, and U.S. Ser. No. 09/599,633, filed Jun. 22, 2000 and abandoned on Aug. 23, 2001.

This invention relates to glyoxal-phenolic condensates, epoxidized derivatives thereof, compositions containing the condensates and/or their epoxidized derivatives, laminates containing such materials and methods for the manufacture of the foregoing.

BACKGROUND AND PRIOR ART

This application relates to subject matter which is similar to that of applicant's U.S. Pat. Nos. 6,001,950 of Dec. 14, 1999 and 6,140,420 of Oct. 31, 2000 but the polyphenolics (condensates) and epoxy derivatives of this invention show an unexpected higher increase in fluorescence as compared to that of the prior patents while, at the same time, showing a high ultraviolet (UV) absorbance.

Polyphenolics, such as those prepared from the condensation of glyoxal and a molar excess of a phenolic monomer such as phenol itself in the presence of an acid catalyst, find utility in the same manner as other polyphenolics and particularly for preparing epoxidized polyphenolics which can be used for coatings and electronic applications as well as adhesives and laminates in the production of printed circuit boards.

Glyoxal-phenolic condensates contain a variety of compounds, including polyphenolics such as di-, tri-, tetraphenolics and higher polyphenolics. When the reactants are phenol itself and glyoxal, the polyphenol is a mixture wherein the predominant tetraphenolic compound is tetrakis (4-hydroxyphenyl)ethane (TPE) which is also referred to as 1, 1, 2, 2-tetrakis(4-hydroxyphenyl)ethane. Glycidylation of the tetrakis(4-hydroxyphenyl)ethane gives the tetraglycidyl ether of tetrakis(4-hydroxyphenyl)ethane. The polyphenolics of this invention will typically contain less than about 6%, preferably less than 4% and particularly less than about 2% or 3% such as less than 1% of TPE.

The condensates and epoxy derivatives of this invention are particularly useful for measurement of fluorescence and/or UV absorbance when automatic optical inspection (AOI) is used for quality control such as in the manufacture of laminates. They can be used alone, after epoxidation, as adducts with epoxy resins, adducts of epoxidized condensates with phenolic novolacs, or in blends with conventional phenolic novolacs and/or prior art glyoxal phenolic condensates such as those of U.S. Pat. No. 6,001,950 which do not have the high fluorescence of this invention. High UV absorbance is desirable for the manufacture of laminates used in electronic applications such as high density multilayer printed circuit boards.

Applicant has found process conditions and the use of oxalic acid as catalyst for obtaining polyphenolics, epoxy derivatives, and compositions containing the foregoing which have unexpectedly high fluorescence with a relatively high UV absorbance. The fluorescence is substantially higher than glyoxal-phenolic condensates prepared by other methods and catalysts within the wavelengths generally used for AOI quality control. Photoimageable materials can be used in conjunction with these condensates.

In this invention, polyphenolics can be obtained with the desirable optical properties, and depending on the method used in making the polyphenolic, one or more additional desirable properties such as: (a) preparation of an essentially metal ion-free polyphenolic without recourse to catalyst filtration or neutralization and water washing steps wherein recovery of phenolic monomer is simplified and the reactor yield is increased in those cases where the catalyst is not neutralized with a metal ion; (b) preparation of polyphenolics with increased solubility in organic solvents; (c) performance of the condensation with a single addition of glyoxal and a single vacuum distillation whereas some other methods use multiple glyoxal additions and vacuum distillations; or the level of tetra(4-hydroxyphenyl)ethane can be unexpectedly low.

The phrase "aldehyde equivalents" as used in this application refers to aldehyde in the glyoxal charged or remaining in the reaction mixture or product when measured by the below described method. Such measurements are reported in aldehyde equivalents reacted in comparison with the aldehyde equivalents charged to the reaction mixture. Thus, if measurements of aldehyde equivalents of the glyoxal charged to the reactor show a total of X aldehyde equivalents and measurements after reaction in the reaction mixture later show aldehyde equivalents of ½ of X, then the aldehyde equivalents reacted are 50% of that charged. Certain ketone groups, referred to as "reactive ketones" are also measured by the below test method. The ketone groups may be formed during the condensation reaction and these are included in measuring of the aldehyde equivalents and are considered as part of the aldehyde equivalents herein. The term "reactive ketone" is used to describe those ketones which affect the per cent of aldehyde equivalents.

The method for determining aldehyde equivalents is by taking 1.0 gram of reaction mixture and diluting it with 50 ml of methanol. The pH is then adjusted to 3.5 with dilute sodium hydroxide. There is then added, to the pH adjusted sample, 25 ml of 10% aqueous hydroxylamine hydrochloride with stirring. The sample is stirred for 10 minutes and then the sample is back titrated with 0.25 Normal (N) sodium hydroxide to pH of 3.5. The number of milliliters (mis) (the titre) of the sodium hydroxide solution used to back titrate the sample to a pH of 3.5 is used to calculate the aldehyde equivalents.

The aldehyde equivalents for the sample are then calculated by the following formula: (2.9 times 0.25 times (mis sodium hydroxide titre).The value obtained by this formula is then compared to the aldehyde equivalents obtained by the above method and formula based on one gram of an unheated mixture of phenolic monomer and glyoxal in the weight ratio of glyoxal to phenolic monomer used until that time or the time in question, after correcting for water which may have been added or remove, e.g., by distillation, in order to determine the percent aldehyde equivalents reacted.

Apart from the above method for determining aldehyde equivalents, the aldehyde groups of the starting glyoxal can simply be compared with the aldehyde groups and reactive ketone groups in the reaction mixture or product to determine the amount of aldehyde and reactive ketone groups reacted. In making the percentage calculations, adjustments again need to be made for the addition or removal of water and the weight ratio of phenolic monomer to gyloxal used at the time in question as compared to that of the initial mixture containing the unreacted glyoxal, keeping in mind that each molecule of glyoxal has two aldehyde groups.

Unless otherwise indicated, the fluorescence measurements herein are based on the maximum counts for a 0.05% solution of the polyphenolic or derivative thereof, dissolved in tetrahydrofuran (THF) at an excitation wave length of 442 nm (nanometers) when measured within the range of about 450 to 650 nm. Although the range of 450 to 650 was measured, the maximum counts for the products of this invention occurs at the 525–535 nm range. It is the maximum counts that are compared in the measurements given in this application. The time for measurement of the maximum counts and the time during which the excitation is measured, such excitation time also referred to as "acquisition time", are the same and in the measurements in this application such time was either one-half second or one second.

When the polyphenolic or derivative thereof is compared with Acridine Orange Base which was purchased from the Aldrich Chemical Company, all experimental conditions are the same except that the Acridine Orange Base is diluted and measured at a concentration of 0.31 mg/liter (milligrams per liter) dissolved in methanol. This concentration of Acridine Orange Base gives about the same amount of fluorescence as that of a 0.05% by weight solution in THF for the resin of Example 7 in applicant's U.S. Pat. No. 6,001,950.

The Acridine Orange Base itself is a solution containing about 75% of the dye when sold by the Aldrich Chemical Co. of Milwaukee, Wis. The Acridine Orange base of Aldrich Chemical Company is described on page 33 of the Aldrich Chemical Company catalogue which is dated 2000–2001. The instrument used to make the measurements is a CM 1000 instrument. CM 1000 refers to Cure Monitor 1000 which is an instrument made by Spectra Group Ltd., Inc. of Maumee, Ohio. Acquisition time is the exposure time at the designated wavelength. A count is a basic unit used by a large number of light measuring devices for data output and refers to a process of digitization of accumulated signal. In the case of a CCD detector that is used by Spectra Group Limited, Inc. of Maumee, Ohio and which was used for the data set forth herein, light produces an electrical charge on the detector that is subsequently read out by a digitizer. The digitizer is set to record one count for approximately every 10 units of charge (electrons) it reads.

The UV absorbance values of this invention are obtained from samples of the polyphenolic or derivatives thereof prepared by dissolving the material in question at a concentration of 0.020 g (grams) per 200 ml (milliliters) of THF (tetrahydrofuran) and the absorbance measurement made at 350 nm (nanometers) or 365 nm.

SUMMARY OF THE INVENTION

In one aspect, this invention relates to polyphenolics having a fluorescence of at least 30% higher, preferably at least 50% higher and particularly at least 80% higher than that of applicant's Example 7 of U.S. Pat. No. 6,001,950. The concentration of the Acridine Orange Base purchased from Aldrich Chemical Co. was diluted with methanol to 0.31 mg/liter for the work in this application so that it would have the same fluorescence intensity as Example 7 of the above 950 patent.

In another aspect, this invention relates to polyphenolics of a phenolic monomer and glyoxal wherein the polyphenolic has an ultraviolet absorbance of at least about 0.400 at 350 nm and/or at least about 0.220 at 365 nm and a minimum fluorescence as set forth in the above paragraph. Preferably, the polyphenolic of this invention will have an ultraviolet absorbance of at least about 0.500 at 350 nm and at least 0.300 at 365 nm which is much the same as that of the 950 patent.

In yet other aspects, this invention is directed to the polyphenolics of this invention, epoxidized products prepared therefrom, compositions containing the polyphenolics or epoxidized derivatives thereof and compositions with other phenolic novolacs and/or epoxidized derivatives thereof.

In still another aspect, this invention is directed to laminates comprising the novel polyphenolics, epoxidized derivatives and compositions thereof as well as the method for the manufacture of such laminates.

In a further aspect, this invention relates to methods for preparing the polyphenolic products of this invention.

DETAILED DESCRIPTION OF THE INVENTION

The Phenolic Monomer

The phenolic monomer is phenol itself or optionally wherein up to 20 mole percent of the phenol is replaced by another monocyclic-monohydric phenolic monomer having from 7 to 9 carbon atoms. When such other phenolic monomer is used together with phenol itself, such phenolic monomer is generally used in a quantity of from about 5 mole percent to about 20 mole percent of the total phenolic monomer charge. The terms "glyoxal-phenolic condensate", "polyphenolics" or simply "condensate" are used herein to describe both the glyoxal-phenol as well as that wherein up to 20% of the phenol has been replaced with another phenolic monomer. Illustrative of the other monocyclic-monohydric phenolic monomers there can be mentioned those having alkyl or alkoxy groups of 1 to 3 carbon atoms substituted in the para, ortho, or meta position of the monocyclic-monohydric phenolic and mixtures thereof. Preferred monocyclic-monohydric phenolics include 3-methylphenol, 3-ethylphenol, 3-methoxyphenol and 3-ethoxyphenol. It is preferred that the glyoxal-phenolic condensate be that of glyoxal and phenol itself or phenol wherein not more than about 10 mole % of the phenol is replaced by another phenolic monomer.

The Glyoxal Reactant

The glyoxal reactant can be in various forms such as relatively pure monomeric glyoxal, polymerized glyoxal or glyoxal dissolved in water. Illustratively, glyoxal is normally used as a 30% to 60% by weight solution of glyoxal in water and particularly a 40% solution in water.

The Acid Catalyst

The acid catalyst used in this invention for the condensation reaction of a phenolic monomer and glyoxal is oxalic acid. Such catalyst can be removed from the reaction mixture by distilling the reaction mixture at a temperature above about 140° C.

Oxalic acid can be used in its various forms such as the pure compound, the dihydrate, or mixtures thereof, all of which are referred to as oxalic acid herein. The oxalic acid catalyst is decomposed to volatile components at the temperatures above about 140° C.

The polyphenols of this invention can be prepared by two different methods.

Preparation of the Glyoxal-Phenolic Condensates by the First Method

In the first method for making the glyoxal-phenolic condensates (polyphenolics) of this invention, glyoxal is added to phenol while the phenol is at a temperature of about 110° C. to about 140° C. to form a reaction mixture while distilling off water. Up to 20 mole % of another monocyclic and monohydric phenolic monomer wherein such monomer has 7 to 9 carbon atoms can replace a portion of the phenol. The reaction is conducted in the presence of about 0.5% to 4% of oxalic acid as catalyst based on the total weight of phenol or phenol with said another phenolic monomer. The molar ratio of the total amount of glyoxal to phenol or phenol together with said another phenolic monomer can vary from about 0.15 to 0.25. The reaction at a temperature of about 110° C. to about 140° C. and distillation of water is continued until at least about 85% of the aldehyde equivalents of the glyoxal have reacted.

The Reaction Conditions for Preparation of the Glyoxal-Phenolic Condensates by the First Method The glyoxal is added to the phenolic monomer, i.e., phenol or phenol with another phenolic monomer, while the phenolic monomer or mixture thereof is heated within a temperature range of about 110° C. to about 140° C. and preferably about 120° C. to about 130° C. The oxalic acid catalyst is preferably present in the heated phenolic monomer at the time the glyoxal is added. Water is distilled out of the reaction mixture while the glyoxal is being added. The glyoxal is added at a rate which does not bring the temperature of the reaction mixture down below about 110° C. Illustratively, the glyoxal addition typically takes about 1 to 3 hours.

The molar ratio of glyoxal to phenolic (phenol or phenol plus other phenolic monomer) in making the glyoxal-phenolic condensates by the first method of this invention is from about 0.15 to 0.25 moles of glyoxal for each mole of phenolic charged and preferably about 0.16 to 0.23 moles of glyoxal for each mole of phenolic charged. Total mole ratios of less than about 0.15 moles of glyoxal for each mole of phenolic charged give more of the tetraphenolics, such as TPE which is essentially devoid of ultraviolet absorbance in the ranges given above for AOI quality control. Ratios of greater than about 0.25 or 0.27 moles of glyoxal for each mole of phenolic monomer lead to longer reaction times and are likely to give product with higher viscosity.

The total time for the condensation reaction of aldehyde with the phenolic monomer prior to removal of catalyst or cooling of the reaction mixture will typically vary from about 6 to about 14 hours and preferably about 7 to about 10 hours.

Preparation of the Glyoxal-Phenolic Condensate by the Second Method

In the method for making the glyoxal-phenolic condensates of this invention by the second method, glyoxal is reacted with phenol in a molar ratio of about 0.15 to about 0.27 moles of glyoxal for each mole of phenol or phenol together with another monocyclic and monohydric phenolic monomer wherein such phenolic monomer has from 7 to 9 carbon atoms and wherein a total quantity of from about 0.5% to about 4% by weight of oxalic acid as the catalyst is used in the method, the quantity of catalyst being based on the weight of phenol or phenol together with the said another phenolic monomer, said method comprising the steps of:

(A) heating and distilling water under vacuum out of a mixture at a temperature of about 55° C. to about 90° C. wherein the mixture comprises substantially all of the glyoxal to be charged in the reaction, phenol and at least 5% by weight of water and wherein the quantity of phenol is from about 5% to about 20% by weight of the total phenolic monomer to be charged in the reaction;

(B) continuing the heating and distillation of water, preferably under vacuum, from the mixture until the amount of water in the mixture is from about 5% to 30% by weight of the mixture;

(C) adding a quantity of from about 0.2% to about 1% of oxalic acid to the mixture to form a reaction mixture in a reactor, said quantity of oxalic acid based on the total quantity of phenolic monomer to be charged in the reaction, heating the reaction mixture at a temperature within the range of about 800 C to 125° C. until from about 15% to about 40% of aldehyde equivalents or aldehyde groups and reactive ketone groups have reacted;

(D) adding the remainder of the oxalic acid and phenol wherein optionally up to about 20 mole % of the phenol to be charged to the reactor is replaced with another monocyclic and monohydric phenolic monomer, said monomer having from 7 to 9 carbon atoms, and heating the reaction mixture at a temperature in the range of about 105° C. to about 135° C. until at least a total of 85% of the aldehyde equivalents or aldehyde groups and reactive ketone groups have reacted.

In a modification of the second method a glyoxal-phenolic condensate is prepared by adding substantially all of the glyoxal and from about 5% to about 20% of phenol by weight of the total quantity of phenolic monomer to be charged to a reactor and about 0.2% to about 1% of oxalic acid, based on the weight of the total quantity of phenolic monomer to be charged in the reactor, to form a reaction mixture wherein the reaction mixture contains from about 10% to 30% by weight of water; heating the reaction mixture at a temperature of within the range of about 80° C. to 125° C. until about 15% to about 40% of the aldehyde equivalents or aldehyde groups and reactive ketone groups have reacted; adding the remainder of the oxalic acid and phenolic monomer wherein said phenolic monomer is phenol or phenol with another monocyclic and monohydroxy phenolic monomer, the said another phenolic monomer having from 7 to 9 carbon atoms, the quantity of said another phenolic monomer being up to 20 mole % of the total quantity of phenolic monomer to be charged to the reactor; and heating the reaction mixture at a temperature in the range of about 105° C. to about 135° C. until at lest 85% of the aldehyde equivalents or aldehyde groups and reactive ketone groups have reacted.

The water in the initial reaction mixture of the second method is generally at least about 5% to about 30% and preferably 10% to 20% by weight of the reaction mixture. However, the quantity of water can be substantially higher, e.g., 60% or more but it then should be distilled out of the mixture before any catalyst is added to get it down to a concentration of about 5% to 30% and preferably about 10% to 20% by weight of the reaction mixture. Typically, the water is present due to the glyoxal being used as an aqueous solution.

Reaction Conditions and Modifications for the Second Method

The molar ratio of glyoxal to phenolic (phenol or phenol plus other phenolic monomer) in the manufacture of the glyoxal-phenolic condensates by the second method is from about 0.15 to 0.27 moles of glyoxal for each mole of phenolic monomer and preferably about 0.16 to 0.25 moles of glyoxal for each mole of phenolic monomer charged to the reactor. Total mole ratios of less than about 0.15 moles of glyoxal for each mole of phenolic charged give more of the tetraphenolics, such as TPE which is essentially devoid of optical properties in the ranges given above for AOI quality control. Ratios of greater than about 0.27 moles of glyoxal for each mole of phenolic monomer lead to longer reaction times and are likely to give product with higher viscosity.

Initially, in the modification of the second method for making the polyphenolics of this invention, substantially all of the glyoxal is mixed with only about 5% to about 20% and preferably about 7% to 15% of phenol based on the total weight of the phenolic monomer to be charged to the reactor.

Due particularly to the usual sale of glyoxal as an aqueous solution, the amount of water in the reaction is often above 30%. To remove water, to the 30% level or less, the mixture of phenol, glyoxal and water is heated at a temperature in the range of about 550 C to about 90° C. and preferably about 60° C. to about 80° C. together with the application of vacuum to distill excess water out of the mixture. However, this step for the removal of water can be omitted if the mixture contains less than about 30% of water and phenol need not be mixed with the glyoxal in the distillation of water to arrive at the requisite quantity of water even when the mixture contains more than about 30% by weight of water. In this regard, it is believed that the only purpose for the distillation of water to bring the water content of the initial mixture to 30% or less is for increasing the speed of reaction. The phenol in the mixture of phenol with the aqueous glyoxal solution for the distillation of water acts as a diluent and helps to keep the glyoxal fluid.

A portion of the oxalic acid catalyst is added to the mixture in the above modification when the water content in the mixture is less than 30%. The portion of catalyst added at this stage is from about 0.2% to about 1% and preferably about 0.4% to about 1% based on the total quantity of phenolic monomer to be charged to the reactor. The reaction mixture which now contains a portion of the catalyst is heated at a temperature of about 80° C. to about 125° C. and preferably about 110° C. to about 120° C. Heating is continued until about 15% to about 40% and preferably about 20% to about 30% of the aldehyde equivalents or aldehyde groups and reactive ketone groups have reacted.

After reaction of about 15% to 40% of the aldehyde equivalents or aldehyde groups and reactive ketone groups, in the above modification, the remainder of the catalyst and phenolic monomer are added to the reaction mixture. The phenolic monomer is phenol or phenol having up to 20 mole % of the phenolic monomer to be charged to the reaction mixture replaced with a phenolic monomer other than phenol.

After addition of the remaining catalyst and phenolic monomer, in the above modification, the reaction mixture is again heated in the range of about 105° C. to about 135° C. and preferably about 110° C. to about 130° C. until at least 85%, preferably at least 90% and particularly at least 95% of the aldehyde equivalents or aldehyde groups and reactive ketone groups have reacted.

In the second method and its modification, the total time for the condensation reaction of aldehyde with the phenolic monomer up to the time of having at least 85% of aldehyde equivalents or aldehyde groups and reactive ketone groups reacted will typically vary from about 5 to about 15 hours and preferably about 7 to about 12 hours.

In both the First and Second Methods for Preparation of the Glyoxal-Phenolic Condensates When the reaction temperature for preparation of the polyphenols is less than about 120° C., distillation under vacuum may be used to remove water. Also, water is distilled off during the removal of catalyst or even during the removal of unreacted phenolic monomer.

The temperature for removal of the oxalic acid catalyst by distillation is generally above 140° C. but less than about 170° C. The temperature is raised above 140° C. to about 170° C., particularly about 155° C. to about 160° C. for removal, generally by decomposition and subsequent distillation of decomposition products of the oxalic acid. However, the temperature can be raised up to about 200° C. to remove the catalyst and, under vacuum distillation, to also remove unreacted phenolic monomer.

The catalyst is preferably removed from the reaction mixture after at least about 85% of the aldehyde equivalents or aldehyde units and reactive ketone units of the total aldehyde equivalents or simply aldehyde units and reactive ketone units have reacted, and preferably when at least about 90% and particularly 93% of such aldehyde equivalents or said units have reacted. However, after the requisite reaction, e.g., after at least 85% of the aldehyde groups have reacted, the reaction mixture can be cooled and stored even though it can still contain water, catalyst and free or unreacted phenolic monomer. At this stage, the reaction mixture can also be referred to as a glyoxal-phenolic raw condensate. The glyoxal-phenolic raw condensate can then be heated to a temperature up to about 200° C., preferably under vacuum, to prepare the glyoxal-phenolic condensate by removing the remaining water, oxalic acid catalyst and all but about 5% or less of free unreacted phenolic monomer.

All or substantially all of the water is removed from the reaction mixture when the catalyst is removed from the reaction mixture. Any water remaining in the reaction mixture after elimination of the catalyst can be removed by the distillation for removal of unreacted phenolic monomer.

After removal of water and the oxalic acid catalyst, unreacted (free) phenolic monomer is generally removed from the reaction mixture so as to bring the free phenolic monomer content of the reaction mixture to less than about 5%, preferably to less than about 2% and particularly less than about 1% by weight of the reaction mixture.

Removal of the unreacted phenolic monomer is attained by conventional means such as in the removal of unreacted phenol in novolac resins, e.g., flash distillation by heating the reaction mixture at an elevated temperature under vacuum. Thus, the temperature can be up to about 195° C. or 200° C. under about 25 to 30 inches of mercury vacuum. Steam sparging under vacuum at such temperatures can also be used to remove unreacted phenolic monomer from the product.

Concurrently with removal of the phenolic monomer, e.g., phenol, or as a separate step following removal of the catalyst, the reaction mixture is optionally heated at a temperature of from about 170° C. to about 200° C., preferably under vacuum, and particularly from about 180° C. to about 195° C. under vacuum. Such heating is conducted for a period of about 0.25 to 3 hours and preferably for about 0.5 to 2 hours. Heating at a temperature of about 170° C. or 175° C. to about 200° C. for about 0.25 to 3 hours generally increases the fluorescence value of the polyphenolic. All or a portion of such heating can be conducted at the time the phenolic monomer is removed under vacuum. Optionally, the polyphenolic with 5% or less of unreacted phenolic monomer can be sparged with an inert gas and heated in the range of about 170° or 175° C. to about 200° C., preferably under vacuum, for about 0.5 to 3 hours. Illustrative of an inert gas there can be mentioned nitrogen or argon. The polyphenolic product is eventually cooled and generally comminuted, e.g., flaked.

The Glyoxal-Phenolic Condensate by the First Method

Properties of the glyoxal-phenolic condensate produced by the above described first method are as follows:

| Property | Broad Range | Preferred Range |
|---|---|---|
| Mw/Mn | 400–700/300–450 | 420–600/320–400 |
| Viscosity, cps at 175° C. | 300–2000 | 350–1000 |

-continued

| Property | Broad Range | Preferred Range |
|---|---|---|
| Free Phenol (%) | 0–5 | <2% and particularly <1% |
| Tetraphenol ethane such as TPE (%) | 0–2 | <1% |
| UV absorbance at 350 nm | at least 0.400 | at least 0.500 |
| UV absorbance at 365 nm | at least 0.220 | at least 0.300 |

Fluorescence: The fluorescence of the glyoxal-phenolic condensate by the first method of preparation of this invention is at least about 50% higher and preferably at least 80% higher as compared to the Acridine Orange Base, under the conditions of measurement hereinabove set forth.

The glycidylated glyoxal-phenolic condensates of the first method of this invention will have a fluorescence which is at least 30% higher and preferably at least 40% higher than that of Acridine Orange Base under the conditions of measurement hereinabove set forth. Also, the glycidylated glyoxal-phenolic condensate of the first method has an ultraviolet (UV) absorbance at 350 nm of at lest 0.300 and preferably at least 0.350 and/or a UV absorbance at 365 nm of at least 0.180 and preferably at least 0.200 by the method given hereinabove.

The Glyoxal-Phenolic Condensate by the Second Method

Properties of the glyoxal-phenolic condensate by the second method are as follows:

| Property | Broad Range | Preferred Range |
|---|---|---|
| Mw/Mn | 450–700/300–450 | 480–650/350–410 |
| Viscosity, cps at 175° C. | 600–2500 | 700–1800 |
| Free Phenol (%) | 0–5 | <2% and particularly <1% |
| Tetraphenol ethane such as TPE (%) | 1 to 6 | 1 to 4 |
| UV absorbance at 350 nm | at least 0.465 | at least 0.530 |
| UV absorbance at 365nm | at least 0.274 | at least 0.300 |

Fluorescence of the polyphenolic product produced by the second method is at least about 30% higher and preferably at least 35% higher than Acridine Orange Base under the conditions set forth hereinbefore.

The glycidylated glyoxal-phenolic condensates prepared by the second method of this invention will have a fluorescence which is at least equal and preferably at least 20% higher than that of Acridine Orange Base under the conditions of measurement hereinabove set forth. The glycidylated glyoxal-phenolic condensates of this invention by the second method will have an ultraviolet (UV) absorbance at 350 nm of at least 0.300 and preferably at least 0.350 and/or a UV absorbance at 365 nm of at least 0.180 and preferably at least 0.200 by the method of measuring given hereinabove.

Preparation of Polyepoxides

The epoxidized products prepared from the polyphenolics (glyoxal-phenolic condensates) of this invention carry over with them the higher fluorescence and UV values of the polyphenolics although the quantity of polyphenolic and hence these optical properties are reduced due to the dilution of the polyphenolic portion of the epoxidized products.

Epoxidized products of the polyphenolics of this invention can be prepared by at least two different conventional routes. One route is by reaction of the glyoxal-phenolic condensate with a halohydrin in the presence of an alkali metal hydroxide to form glycidyl ethers of the polyphenolic. Such epoxidized products will typically have epoxy equivalent weights of about 190 to 230 and preferably about 205 to 225. Another route is by reacting a molar excess of a preformed polyfunctional epoxy with the glyoxal-phenolic condensate. Such epoxidized products by the latter route will typically have epoxy equivalent weights (WPE) of about 140 to 250 and preferably about 160 to 230.

In the first route for preparation of the polyepoxide, the polyepoxide is prepared by contacting the glyoxal-phenolic condensate with an excess of epichlorohydrin in the presence of an alkali metal hydroxide such as sodium hydroxide or potassium hydroxide at a temperature within the range of about 50° C. to about 80° C. Optional catalysts, such as quaternary ammonium salts, may be employed. The reaction can be carried out in the presence of an inert solvent, including alcohols such as ethanol, isopropanol, methyl isobutyl ketone (MIBK), toluene, ethers, and mixtures thereof.

Another method for preparing the polyepoxide by the first route is set forth in U.S. Pat. No. 4,518,762 of May 21, 1985 to Ciba Geigy Corp. which is incorporated herein by reference in its entirety. Briefly, in this process, the polyphenolic, preferably the glyoxal-phenolic purified product, is reacted at a temperature of 40° to 100° C., in the absence of any catalyst specific for the formation of the chlorohydrin ether intermediate, in the presence of 2 to 25% by weight, based on the reaction mixture, of a lower alkanol or lower alkoxy-alkanol cosolvent, with excess epichlorohydrin, based on the phenolic hydroxy value, in the presence of 0.5 to 8% by weight of water, based on the reaction mixture, and with 0.9 to 1.15 equivalents of solid alkali metal hydroxide per phenolic hydroxyl group to give the epoxy derivative of the polyphenolic and wherein there is 0.5% to 8% by weight of water in the reaction mixture throughout the reaction period, using a solid alkali metal hydroxide in the form of beads of about 1 mm diameter, which hydroxide is charged to the reaction mixture portionwise or continuously during a gradually escalating addition program, and then isolating the epoxy novolac resin.

In the route for preparation of the epoxy resins which involves reacting a molar excess of a preformed polyfunctional epoxy with the glyoxal-phenolic condensate, one part by weight of such condensate is reacted with about 4 to about 8 parts of a polyepoxide at about 100° C. to about 150° C. using a catalyst, e.g., potassium hydroxide, benzyldimethylamine, benzyltrimethylammonium hydroxide, 2-methyl imidazole, and 2,4,6-tris (dimethylaminomethyl)phenol. Typical catalyst levels are about 0.1% to about 0.6% based on the reaction mass. Typical polyepoxides for reaction with the polyphenolic of this invention are those of diglycidyl ether resins, e.g., the diglycidyl ether resins of: bisphenol A; bisphenol F; resorcinol; neopentyl glycol; cyclohexane dimethanol; and mixtures thereof.

The polyphenolics of this invention can also be partially epoxidized without sacrifice in the desirable optical properties by reduction of the quantity of alkali used in the reaction with epichlorohydrin. Illustratively, reduction of caustic to about 40% to 70% of that in the methods of the above described first route affords partially epoxidized derivatives.

The term "residue" or "residues" of a glyoxal-phenolic condensate refers to the glyoxal-phenolic derivative portion of a reaction product, e.g., in reaction with an epoxy resin. The quantity of residue is the amount of glyoxal-phenolic condensate of this 15 invention used in making a reaction product such as a resin or compound. Illustratively, if 10 grams of a glyoxal-phenolic condensate is reacted with 40 grams of an epoxide, the glyoxal-phenolic condensate residue of the composition would be 10 grams. Also, if 20 grams of a glyoxal-phenolic condensate is glycidylated and the glycidylated product is subsequently reacted with a phenol-formaldehyde novolac, the glyoxal-phenolic residue would still be 20 grams.

Unless the context indicates otherwise, the polyphenolics and various resins of this invention, e.g., epoxy resin derivatives thereof (including the glycidylated polyphenolics) and phenol novolacs are reactive, curable materials.

The glyoxal-phenolic condensates of this invention will typically have a percent by weight concentration of metal ions of less than about: 0.005% for sodium; 0.003% for calcium; 0.003% for iron; and 0.002% for potassium for a total concentration of such ions of less than about 0.013%.

The condensates of this invention can be used alone to cure epoxy resins but preferably they are used in combination with other epoxy resin curing agents such as a conventional phenolic novolac resin, e.g., one which does not have the high fluorescence values of this invention. Such other curing agent can comprise about 50% to 97% by weight of such curing composition and the glyoxal-phenolic condensate can comprise about 1% to 50% by weight of such curing composition. Preferably, the other curing agent can comprise from about 50% to 95% by weight of such curing composition and the glyoxal-phenolic condensate can comprise about 1% to 50% by weight of such curing composition. About 10 to 30 parts of this type of curing composition can be used to cure 100 parts of epoxy resin.

Compositions of this invention can contain, for each 100 parts of a conventional epoxy resin, i.e. which does not have the high fluorescence values of this invention, or simply resin, about 1 to 35 parts based on the weight of the epoxy resin, the inventive glyoxal-phenolic condensates, epoxidized derivatives thereof, and mixtures containing the condensates and epoxidized derivatives.

The preferred polyepoxide products of this invention when used in electronic applications such as laminates for the production of printed circuit boards will typically comprise the following composition based on 100 parts of an epoxy resin, e.g., an epoxy resin such as the diglycidyl ether of bisphenol A:

(a) about 10–30 parts of a curing agent such as a phenol-formaldehyde novolac;

(b) about 1 to 30 parts and preferably about 2–20 parts of a member selected from the group consisting of a glycidylated polyphenolic of this invention, a reaction product of an epoxy resin and a polyphenolic of this invention, a polyphenolic of this invention, and mixtures thereof; and (c) optionally, an epoxy curing accelerator.

Epoxy resins useful in this invention can be conventional epoxy resins, i.e., those not containing the high fluorescent glyoxal-phenolic residue of this invention. Such resins can have WPE values of about 190 to about 10,000 and preferably about 190 to about 500. Illustrative of such conventional epoxy resins, or simply epoxy resins, there can be mentioned those of diglycidyl ether resins, such as those having the above mentioned WPE values, prepared by contacting a dihydroxy compound with an excess of epichlorohydrin in the presence of an alkali metal hydroxide wherein the dihydroxy compound can be: bisphenol A; brominated bisphenol A, particularly tetra brominated bisphenol A; bisphenol F; resorcinol; neopentyl glycol; cyclohexanedimethanol, and the like; and mixtures thereof. Such resins are also referred to as being based on or derived from the dihydroxy compound involved, e.g. bisphenol A. Also, such conventional epoxy resin can be that of: epoxy phenol novolacs; epoxy cresol novolacs; aromatic glycidyl amine resins such as tri glycidyl-p-amino phenol; N, N, N',N'-tetraglycidyl-4, 4'-diaminodiphenyl methane; glycidyl ethers of a phenolic novolac; glycidyl ethers of an o-cresol/formaldehyde novolac; poly(glycidylated) copolymers of glycidyl methacrylate wherein the comonomer includes unsaturated compounds such as acrylates, methacrylates and styrene; and mixtures of the various conventional epoxy resins. Non-glycidylated epoxy resins may also be employed. Examples of such non-glycidylated epoxy resins include: limonene dioxide (weight per epoxy of 85); vinyl cyclohexene dioxide; divinyl benzene dioxide; 5-vinyl-2-norbornene dioxide (weight per epoxy of 76); 1,5-heptadiene dioxide; 1,7-octadiene dioxide. The non-glycidylated epoxy compounds are preferably used in conjunction with glycidylated epoxy resins and are also useful as diluents.

The conventional epoxy resin can be a flame retardant epoxy resin such as a halogenated epoxy resin, e.g., chlorinated or brominated epoxy resin. Illustrative of such brominated epoxy resins there can be mentioned the brominated product of the diglycidyl ether of bisphenol A, e.g., EPON 1124 (CAS No.: 26265-08-07) of Shell Chemical Co. Such brominated epoxy resins can be used in flame retardant compositions with other epoxy resins.

Preferred, non-conventional epoxy resins of this invention include: glycidylated polyphenolics of a phenol and glyoxal wherein the polyphenolic prior to glycidylation has a fluorescence which is at least 30% higher than Acridine Orange Base by the test method given herein or glycidylated polyphenolics of this invention having a fluorescence which is at least equal to that of Acridine Orange Base by the test method given hereinabove; and a reaction product of about 4 to 8 parts of a conventional glycidyl epoxy resin to each part of a polyphenolic of a phenol and glyoxal of this invention having a fluorescence which is at least 30% higher than Acridine Orange Base by the test method given hereinabove or such inventive reaction product having a fluorescence which is at east equal to Acridine Orange Base by the test method given hereinabove.

Epoxy curing accelerators can be used in a quantity sufficient to accelerate the cure of the epoxy resin. Generally, such quantity is from about 0.05 to 0.5 parts based on 100 parts of the epoxy resin and particularly about 0.1 to 0.2 parts. Such accelerators include 2-methylimidazole, 2-ethyl4-methylimidazole, amines such as 2,4,6-tris (dimethylaminomethyl)phenol and benzyldimethylamine, and organophosphorus compounds such as tributylphosphine and triphenylphosphine.

Reactive diluents may also be present to lower viscosity and improve handling characteristics. Examples of reactive diluents include neopentylglycol diglycidyl ether; butanediol diglycidyl ether; resorcinol diglycidyl ether; and cyclohexane dimethanol diglycidyl ether.

A variety of curing agents well known in the art can be used for the epoxy resin. They include but are not limited to aromatic amines, polyamidoamines; polyamides; dicyandiamide; phenol-formaldehyde novolacs; melamine-formaldehyde resins; melamine-phenol-formaldehyde resins; and benzoguanamine-phenol-formaldehyde resins.

When phenol novolacs are used as curing agents a catalyst (accelerator) i generally employed and may be selected from tertiary organic amines such as 2-alkylimidazoles; benzyldimethylamine; and phosphines such as triphenylphosphine and mixtures thereof.

The phenol novolac curing agents are condensation products of a phenol with an aldehyde or ketone wherein the phenol can be selected from phenol itself, cresols, xylenols, resorcinol, bisphenol-A, paraphenyl phenol, naphthol, and mixtures thereof. Substituents for the phenolic monomers include hydroxy, alkyl of 1 to 4 carbon atoms, alkoxy of 1 to 4 carbon atoms as well as phenyl. Novolacs and dicyanodiamide are preferred curing agents. Particularly preferred curing agents are the phenol-formaldehyde novolacs and ortho-cresol-formaldehyde novolacs having a molecular weight of about 300 to 5,000 and preferably about 1,000 to 5,000. Illustrative of the aldehydes for preparation of the phenol novolac curing agents there can be mentioned formaldehyde, acetaldehyde, benzaldehyde and hydroxybenzaldehyde. Illustrative of ketones for preparation of the phenol novolac curing agents there can be mentioned acetone, hydroxyacetophenone, and methyl ethyl ketone.

A wide variety of solvents may be used in the compositions of this invention, including halogenated solvents, ketones, alcohols, glycol ethers, glycol acetates, N,N-dimethylformamide. The latter is particularly useful when dicyandiamide is used as curing agent. Ketones include acetone, methyl ethyl ketone, diethyl ketone, and methyl isobutyl ketone.

The laminates of this invention will generally contain about 20% to 60% by weight of resinous matrix material and about 40% to 80% by weight of reinforcing material such as glass cloth.

The structure of the laminates of this invention are the same as those of conventional laminates containing a reinforcing agent such as glass cloth, and a resinous matrix comprising an epoxy resin and a curing agent for the epoxy agent such as a phenol-formaldehyde resin, except that the resinous matrix will also contain from about 1 to 35 parts by weight, preferably about 1 to 15 parts by weight, based on the weight of of the resinous matrix, of a glyoxal-phenolic condensate, residue or mixture thereof. The epoxy resin, curing agent, glyoxal-phenolic condensate or residue thereof and optionally a solvent system for the epoxy and curing agent, can comprise at least 40% by weight of the resinous matrix or mixture.

The resinous matrix of the laminates of this invention containing a solvent will generally contain, by weight, (1) from about 40 to 80 and preferably 50 to 70 parts of an epoxy resin; (2) about 1 to 15 parts of a condensate of this invention or an epoxidized residue of said condensate or mixture thereof; (3) about 10 to 35 and preferably 15 to 30 parts of a solvent; and about 7 to 35 parts of an epoxy curing agent. The epoxidized residue can be that of a glycidylated condensate (polyphenolic) of this invention or that of the reaction of 4 to 8 parts of an epoxy resin for each part of the condensate.

The laminates of this invention can be made flame retardant by conventional techniques such as: (a) the use of a halogenated epoxy resin as the main resin matrix ingredient; (b) a brominated or chlorinated flame retardant additive such as chlorinated bisphenol-A, tetrabrominated bisphenol-A or tris(2,3-dibromopropyl)phosphate; or (c) the use of a non-halogenated flame retardant such as a nitrogen containing resin such as a triazine, e.g., a melamine-formaldehyde resin, a melamine-phenol-formaldehyde resin, a melamine-benzoguanamine-phenol-formaldehyde resin or a benzoguanamine-phenol-formaldehyde resin. The nitrogen containing curatives are preferably used together with a phosphorus containing material. Illustrative of the phosphorus containing material there can be mentioned organic and inorganic phosphorus containing materials such as: aryl phosphates and phosphites such as the trade named product PHOSFLEX 580 of Akzo-Nobel; triarylphosphines such as triphenylphosphine; triarylphosphorus oxides such as triphenylphosphorus oxide; alkyl-aryl phosphites such as the trade named products ULTRANOX 626 and WESTON PNPG, both from GE Specialty Plastics; ammonium phosphates; red phosphorus; and mixtures thereof. The phosphorus containing materials can be employed at levels of about 2% to 15% based on 100 parts of the primary epoxy resin. By the term primary epoxy resin is meant the conventional or epoxy resin which is not prepared from a glyoxal-phenolic condensate of this invention.

The epoxy resin used in the laminate compositions of this invention will have a weight per epoxide (WPE) value of from about 190 to 10,000 and preferably from about 190 to 500. The epoxy resins for laminating and coating formulations are generally solvent based. Coating formulations may include fillers whereas laminating formulations generally impregnate multiple layers of a fiber matrix such a glass cloth with a phenolic compatible finish.

The laminate can be prepared at room temperature or by heating under pressure a layer comprising at least one sheet of prepreg comprising an epoxy resin as impregnate. The pressure used in making the laminates can vary from the contact pressure of applying a laminated lining to a tank wall to the high pressure, e.g., 1,000 psi or more, used in the manufacture of electrical insulation sheets. The temperature used in making the laminates can vary over a wide range such as that of about room temperature to over 210° C. The use of a solvent in the laminate compositions is optional. Conventional laminating techniques can be used in making the laminates of his invention such as the wet or dry-lay-up techniques.

Reinforcing fibers or fabrics of reinforcing fibers for use in laminates include glass fibers and mats; carbon and graphite fibers, cellulosic paper, fibrous polyamide sheets, fibrous quartz sheets, woven fibrous glass cloth, unwoven fibrous glass mat, and the like. Fillers such as quartz powdered, mica, talc, calcium carbonate and the like may also be added to the resinous matrix in the laminate.

The weight average molecular weight (Mw) and number average molecular weight(Mn) herein are measured using gel permeation chromatography and phenolic compounds and polystyrene standards. The sample molecular weight to be measured is prepared as follows: the sample is dissolved in tetrahydrofuran and the solution is run through a gel permeation chromatograph. Any free phenolic in the sample is excluded from calculation of molecular weight.

"Viscosity, cps at 175° C." or "C&P, cps (175° C.)" is the viscosity in centipoises as measured by cone and plate melt viscosity using a No. 40 cone.

The quantity of TPE in the various reaction mixtures was determined by the following method.

(a) The reagents used were para-ethyl phenol, TPE, and silylation reagent.

(b) Procedure for determining TPE was as follows:

A silylation reagent was prepared as follows: into 25 ml (milliliter) reaction flask, add by syringe: 10 cc (cubic centimeters) of pyridine, 3 cc of trimethylchlorosilane (TMCS), and 10 cc of hexamethyldisilazane (HMDS). This was left to stand for 5 to 10 minutes.

(c) The TPE standard solution is prepared as follows:

Weigh into vial (appropriate for silylation) approximately 30 mg each TPE and p-ethylphenol. Add 1 cc silylation reagent. Shake until dissolved (approximately 10 minutes). Heat in low temperature oven overnight. Inject 1 microliter into gas chromatograph. Use methyl ethyl ketone as rinses. The column used for this analysis is Dexsil 300 which is supplied by Supelco of Belfonte, Pa.

In order that those skilled in the art may more fully understand the invention presented herein, the following examples are set forth. All parts and percentages in the examples, as well as elsewhere in this application are by weight, unless otherwise specifically stated.

The following Examples 1–4 are representative of the first method for production or use of the polyphenols of this invention whereas Examples 5–13 are representative of the second method for production or use of the polyphenols of this invention.

EXAMPLE 1

A two liter multi-neck flask was charged with 1,400 grams (g) phenol (14.87 moles) and 28 g oxalic acid dihydrate (2% by weight based on the phenol) and the contents heated under nitrogen blanket to 130° C. 367.7 g of 40% aqueous glyoxal (2.536 moles) (glyoxal/phenol mole ratio is 0.17) was added over 2.25 hours during this time about 200 ml (milliliters) of distillate was collected. The temperature of 130° C. was maintained for an additional 2 hours at which time a total of about 43.5 g of phenol and 219.2 g of water collected and the remaining aldehyde equivalents were 1.45%. This corresponds to 83% aldehyde conversion but 86% when corrected for distillate. An additional 4 hours of heating at 130° C. and 1.5 hours at 135° C. reduced the aldehyde equivalents to 0.62%, i.e. 93% aldehyde conversion (but 95% when corrected for distillate). One half (721 g) of the reaction mixture was transferred to a one liter flask which was heated to 160° C. and 21.3 g of additional distillate collected. The temperature of 160° C. was maintained for one hour. The reaction was then vacuum distilled at 160° C. to 176° C. at 16.5 to 30 inches of mercury vacuum to recover 268 g of product and 428 g of phenol distillate. 39.7 g of product was further heated one hour at 190° C. to give 39.2 g under 29.5 inches of vacuum.

EXAMPLE 2

The procedure of Example 1 was essentially followed but using a glyoxal/phenol mole ratio of 0.20 (i.e., 1.48/7.44) instead of 0.17. Glyoxal was added over 2 hours and 53 minutes at 128–130° C. at which time 182 g distillate (19.6% of charge) was collected. The aldehyde equivalents determined one minute afterward was found to be 2.1% which represents 78% aldehyde conversion (but 83% when corrected for distillate). After further heating at 130° C. for 3 hours, the aldehyde equivalents was 0.58% which represents 94% aldehyde conversion (but 95% when corrected for distillate). After heating 1 hour at 160° C. the aldehyde equivalents was 0.36% which represents 96% aldehyde conversion (but 97% when corrected for distillate). Unreacted phenol was recovered by heating to 190° C. under 29 inches of vacuum and then held at this temperature for 1 hour.

Properties of the glyoxal-phenol condensate for the above Examples 1 and 2 are given in Table 1A and Table 1 B below. The reaction products of the portion which was heated at 190° C. as well as that which was not so heated can be flaked by conventional means used for flaking a novolac resin.

In Table 1A and Table 1 B below, the headings in the tables have the following meanings.

(a) "Ex." is the example number. Under the "Ex" designator: the letter "P" refers to example 7 of U.S. Pat. No. 6,001,950 which issued on Dec. 14, 1999 to the instant inventor; EP8 is the epoxy of Example 8 in the above mentioned 950 patent wherein the epoxy was made by substantially the same method as set forth in Example 3 of this application; and EPON is the commercial epoxy resin "EPON 1031" (CAS 7328-97-4) which is a polyphenol containing tetraglycidyl ether of tetrakis(hydroxyphenyl) ethane and which is sold by Shell Oil Co. of Emeryville, Calif.

(b) "Mole Ratio" is the mole ratio of glyoxal to the phenol or to the sum of phenol and any phenolic comonomer which was used.

(c) "Feed, ° C." is the temperature of the phenolic or reaction mixture at the time the glyoxal was being added.

(d) "Mw/Mn" refers to the weight average molecular weight/the number average molecular weight.

(e) "% TPE" is the percent of tetrakis(p-hydroxyphenyl) ethane or tetraphenolic ethane, if a phenolic comonomer was used, by weight, based on the total weight of the product.

(f) "C&P, cps (175° C.)" is the viscosity in centipoises as measured at 175° C. as measured by cone and plate melt viscosity using a No. 40 cone.

(g) "Phenol, %" is the percent of unreacted phenol and other phenolic monomer, by weight, based on the total weight of the product.

(h) "UV 350/365 nm" represent the ultraviolet absorbance values respectively at 350 nm and at 365 nm obtained from samples prepared by dissolving the material in question in THF (tetrahydrofuran) at a concentration of 0.020g/200 ml of THF.

(i) "Fluorescence max, nm" is the wavelength, measured in nanometers, which showed the maximum fluorescence (maximum counts) by the method described hereinabove. This wavelength was generally at about 528 nm to about 532 nm.

(j) "ND" or simply a dash ("-") means not determined.

(k) "Fluorescence, %" represents the fluorescence of the polyphenolic or epoxidized polyphenolic of the indicated example in comparison to Acridine Orange Base as discussed hereinabove. The Acridine Orange Base is measured at a concentration of 0.31 mg/liter dissolved in methanol and its reading is given the value of 100%. The polyphenolics are measured at a concentration of 0.05 weight percent in THF. Thus, if the fluorescence of a polyphenolic is 181%, it means that it is 81% greater (higher)than the fluorescence of Acridine Orange Base under the test conditions.

(l) "A" designates post treatment of the previous Example at 190° C. for one hour at about 29.5 inches of vacuum.

TABLE 1A

| Ex | Mole Ratio | Feed, ° C. | Mw/Mn | % TPE |
|---|---|---|---|---|
| 1 | 0.17 | 130 | 433/331 | 0.28 |
| 1A | 0.17 | 130 | 444/338 | 0.35 |
| 2 | 0.20 | 130 | 432/328 | 0.96 |
| 3 | ND | ND | 499/339 | ND |
| P | 0.17 | ND | ND | ND |
| EPON | ND | ND | 895/395 | ND |
| EP8 | ND | ND | 576/348 | ND |

TABLE 1B

| Ex | C&P, cps (175° C.) | % Phenol | UV 350/365 nm | Fluorescence max, nm | Fluorescence % |
|---|---|---|---|---|---|
| 1 | 432 | 0.32 | 0.426/0.262 | 532 | 181 |
| 1A | 684 | ND | 0.563/0.342 | 530 | 185 |

TABLE 1B-continued

| Ex | C&P, cps (175° C.) | % Phenol | UV 350/365 nm | Fluorescence max, nm | Fluorescence % |
|---|---|---|---|---|---|
| 2 | 355 | 0.77 | 0.528/0.337 | 530 | 273, 251 |
| 3 | 155* | ND | 0.346/0.213 | 530 | 141 |
| P | 720 | ND | 0.544/0.300 | 532 | 100 |
| EPON | ND | ND | 0.273/0.161[b] | 527 | 57 |
| EP8 | 279* | ND | 0.400/0.223 | 528 | 88, 89 |

*cps as measured at 150° C. instead of 175° C.
[b]This value is found in the 950 patent.

It can be seen from the above Tables 1A and 1B that:

(a) The fluorescence of the glyoxal-phenol condensate of Example 1 and Example 2 of this invention is about 80% to over 260%, respectively, higher than that of Example 7 in the 950 patent.

(b) The fluorescence of the condensate of Example 3 of this invention, which is the glycidylated product of Example 1 of this invention, is about 52% higher than the epoxy product of Example 8 of the 950 patent.

(c) The fluorescence of Example 3 of this invention is about 84% greater than the fluorescence of EPON 1031.

(d) The ultraviolet absorbance of the epoxy product of Example 1 in this invention is substantially greater than that of EPON 1031 but about the same as that of Example 8 of the 950 patent.

EXAMPLE 3

A one liter flask is charged with: 184 g (grams) of a flaked reaction product prepared in the manner of Example 1; 490.4 g of isopropyl alcohol; and 128.8 g of water to form a reaction mixture. The reaction mixture is heated to 55° C. After 10 minutes there is added 953.1 g of epichlorohydrin. The reaction mixture is reheated to 55° C. and then 73.6 g of a 20% solution of sodium hydroxide in water is added while maintaining a temperature of 55° C. The 55° C. temperature is held for another 30 minutes. Then there is added, over a period of one hour, 220.8 g of 20% solution of sodium hydroxide in water. The reaction mixture is held at 550 C for 30 minutes and then transferred to a separatory funnel. The upper clear brown organic layer is stirred with 330 g water and 66 g of dry ice. The aqueous layer is discarded and the organic layer washed a second time and then vacuum distilled to recover excess epichlorohydrin and about 205 g of dark resin of the epoxidized product of Example 1. This epoxy resin has a weight per epoxy equivalent of about 221. This compares with a weight per epoxy equivalent of 210 for EPON 1031. The epoxy resin of this example shows an ultraviolet absorbance and fluorescence which is substantially higher than that of EPON 1031.

EXAMPLE 4

Prepregs and laminates were made from the following resinous matrix formulation.

| Material | Percent by weight |
|---|---|
| 1. Brominated epoxy resin (EPON 1124 A80 of Shell Chemical) | 60.0 |
| 2. Glyoxal-phenolic condensate of Example 1 | 3.0 |
| 3. Phenol novolac curing agent (Durite SD1711 of Borden Chemical) | 14.4 |
| 4. Acetone | 15.05 |
| 5. Methyl ethyl ketone | 7.45 |
| 6. 2-methyl imidazole | 0.2 |

Two-ply 11.5 inch square laminates of 7–8 mils thickness are made via a hand dip process using 2116 style glass (an E-glass) with a BGF 643 finish. Cure conditions are typical for meeting the National Electrical Manufacturers' Association (NEMA) FR4 specification, namely, 1.5 minutes at 325–350° F. in an oven for the prepreg. The prepreg is then cooled to room temperature and heated over 45 minutes to 350° F., and then held at this temperature for about 30 minutes before cooling to room temperature. The resin content for the laminates is about 60% by weight.

The laminates are then cut into 4 inch squares and inspected with modern automatic optical inspection (AOI) equipment. In the case of ultraviolet absorbance, the following equipment can be used: Hewlett-Packard's HP BV 3000, Teradyne's 5539 and Orbitech's VT 8000.

The formulation of this Example 4 is a preferred formulation. However, the brominated epoxy resin can vary from about 40% to 80% by weight of the formulation, and such resin can be substituted with a different halogen such as chlorine. Also, the epoxy resin need not be halogenated but if fire retardency is desired, such retardency can be obtained by the addition of a conventional fire retardant. The glyoxal-phenolic condensate of Example 1 can vary in quantity over a broad range such as that from about 1% or 2% to about 15% and be substituted entirely or partially with an equal quantity of a glyoxal-phenolic condensate residue. The quantity of phenol novolac curing agent can vary from about 7% to about 35% and the quantity of solvent system can vary from about 10 to 35%, all percentages or parts being by weight.

EXAMPLE 5

A mixture of 97.4 g (grams) phenol and 300 g of 40% glyoxal in water (2.07 moles) is vacuum distilled at 65° C. to 75° C. to collect 151 g distillate. The aldehyde equivalents at this stage are a total of about 49%. Oxalic acid dihydrate (4.0 g) is added and the reaction heated to 115° C. and maintained at this temperature for 1 hour. The total aldehyde equivalents at this stage is about 37.5%. Thus, at this stage, about 24% of the aldehyde equivalents reacted. The reaction mixture is then cooled to 105° C. and 800 g phenol (total of 897.4 g or 9.54 moles; glyoxal/phenol mole ratio now is 0.217) and the % aldehyde equivalence was 7.24%. Also, 14.0 g oxalic acid dihydrate was added. The temperature was raised to 115° C. over the course of 1 hour and maintained at 115° C. for 5 hours. During this time, 25 ml (milliliters) distillate had been collected and about 78% of aldehyde equivalents had reacted. The reaction temperature was then raised to 125° C. over 10 minutes and held at 125° C. for 120 minutes at which time an additional 35 g distillate was collected and about 89% of the aldehyde equivalents had reacted, i.e., the aldehyde equivalents remaining were 0.8%. The reaction mixture was then distilled at atmospheric pressure by heating to 160° C. and maintained at 160° C. for 1 hour. The reaction mixture was then vacuum distilled to remove the bulk of unreacted phenol at 175° C. under 29.75 inches of mercury vacuum.

EXAMPLES 6 and 7

These examples were performed in the same manner as Example 5, except as noted in Table 2A and Table 2B.

EXAMPLE 8

The procedure of Example 5 was followed except that: (a) 4 g of the oxalic acid dihydrate was present initially during the dehydration of glyoxal; and (b) the reaction mixture was heated one hour at 75° C. instead of 115° C. prior to addition of the 800 g of phenol. The percent aldehyde equivalents prior to the step of heating to 160° C. was 0.54% and 0.29% after one hour at 160° C.

EXAMPLE 9

The procedure of Example 5 was followed except that 94.2 g (1.0 mole) of phenol was replaced by 108.1 g (1.0 mole) of m-cresol after the first hold at 115° C. for 1 hour in the presence of 4.0 g oxalic acid dihydrate. The % of aldehyde equivalents in the reaction mixture after 1 hour at 160° C. was 0.65%.

EXAMPLE 10

The procedure of Example 5 was essentially followed except that 4.0 oxalic acid dihydrate was charged to flask with the glyoxal and 97.4 g of phenol.

EXAMPLE 11

A three liter flask is charged with: 300 g (grams) of a flaked reaction product prepared in the manner of Example 7 above; 800 g of isopropyl alcohol; and 210 g of water to form a reaction mixture. The reaction mixture is heated to 55° C. After 10 minutes there is added 1554 g of epichlorohydrin. The reaction mixture is reheated to 55° and then 120 g of a 20% solution of sodium hydroxide in water is added while maintaining a temperature of 55° C. The 55° C. temperature is held for another 30 minutes. Then there is added, over a period of one hour, 360 g of 20% solution of sodium hydroxide in water. The reaction mixture is held at 55° C. for another 30 minutes and then transferred to a separatory funnel. The upper clear brown organic layer is stirred with 500 g water and 100 g of dry ice. The aqueous layer is discarded and the organic layer washed a second time, atmospherically distilled to 125° C., and then vacuum distilled to 125° C. under 29 inches of vacuum to recover excess epichlorohydrin and dark resin of the epoxidized product of Example 7. As is customary in this type of epoxidation, vigorous agitation was used during this example. This epoxy resin has a weight per epoxy equivalent of about 221. This compares with a weight per epoxy equivalent of 210 for EPON 1031, an epoxy resin of a polyphenol sold by the Shell Oil Company. The epoxy resin of this example shows an ultraviolet absorbance and fluorescence which is substantially higher than that of EPON 1031, as can be seen from Table 2B below.

Following the procedure of the above Example 11 the epoxy prepared from Example 6 in U.S. Pat. No. 6,001,950 (the 950 patent) was made. It had a weight per epoxy equivalent of about 217 and is further characterized in Table 1B below.

EXAMPLE 12

Prepregs and laminates were made from the following resinous matrix formulation.

| Material | Percent by weight |
|---|---|
| 1. Brominated epoxy resin (EPON 1124 A80 of Shell Chemical) | 60.0 |
| 2. Glyoxal-phenolic condensate of Example 5 wherein the condensate was heated at 190° C. for one hour | 3.0 |
| 3. Phenol novolac curing agent (Durite SD1711 of Borden Chemical) | 14.4 |
| 4. Acetone | 15.05 |
| 5. Methyl ethyl ketone | 7.45 |
| 6. 2-methyl imidazole | 0.2 |

Two-ply 11.5 inch square laminates of 7–8 mils thickness are made using the above formulation via a hand dip process using 2116 style glass (an E-glass) with a BGF 643 finish. Cure conditions are typical for meeting the National Electrical Manufacturers' Association (NEMA) FR4 specification, namely, 1.5 minutes at 325–350° F. in an oven for the prepreg. The prepreg is then cooled to room temperature and heated over 45 minutes to 350° F., and then held at this temperature for about 30 minutes before cooling to room temperature. The resin content for the laminates is about 60% by weight.

The laminates are then cut into 4 inch squares and inspected with modern automatic optical inspection (AOI) equipment. In the case of ultraviolet absorbance, the following equipment can be used: Hewlett-Packard's HP BV 3000, Teradyne's 5539 and Orbitech's VT 8000.

The formulation of this Example 12 is a preferred formulation. However, the brominated epoxy resin can vary from about 40% to 80% by weight of the formulation, and such resin can be substituted with a different halogen such as chlorine. Also, the epoxy resin need not be halogenated but if fire retardency is desired, such retardency can be obtained by the addition of a conventional fire retardant. In Example 12, The glyoxal-phenolic condensate of Example 5 can vary in quantity over a broad range such as that from about 1% or 2% to about 15% and be substituted entirely or partially with an equal quantity of a glyoxal-phenolic condensate residue. The quantity of phenol novolac curing agent can vary from about 7% to about 35% and the quantity of solvent system can vary from about 10 to 35%, all percentages or parts being by weight.

EXAMPLE 13

The procedure of Example 5 was followed except that: (1) instead of adding 4 g of oxalic acid and heating to 115° C. for one hour in the initial charge of the oxalic acid as recited in Example 5, the amount of oxalic acid in this Example 13 was increased to 8 g and the temperature was raised to 123°–125° C. for twenty minutes and then lowered to 115° C. for another 20 minutes at which time 34 g of distillate had been collected; and (2) instead of adding 14g of oxalic acid as in Example 5 in the second charge of oxalic acid, only 10 g of oxalic acid was added in the second charge. The percent aldehyde equivalents after the above heating at 115° C. for 20 minutes and 125° C. for another 20 minutes was 38.4% (but 33.4% when corrected for the 34 g of distillate) and the aldehyde conversion, i.e., the percent decrease in aldehyde units together with any reactive ketone units at this stage from that in the initially charged glyoxal was 32%. The aldehyde units and the reactive ketone units can also be referred to as "reactive carbonyl groups". Immediately after addition of 800 g phenol, the aldehyde equivalents were determined to be 7.24%. Just prior to removal of the catalyst from the reaction mixture, the percent aldehyde equivalents was 0.36% (but 0.34% when corrected for 66.6 g of distillate obtained after heating 1 hour at 160° C.) and the aldehyde conversion from the initial glyoxal charge was 95%.

Glyoxal-phenolic condensate products as well as epoxidized products of this invention, or those performed so as to be compared with this invention, are characterized in Table 2A and Table 2B wherein the headings in the tables are as follows:

The terms "Ex", "P", "Mole Ratio", "Phenol %", "TPE %", "UV", "Fluorescence Max" "Fluorescence %", "ND", "UV", "Mw/Mn", "EPON", C&P, cps (175° C.), the asterisk "*" symbol, the "$^{(h)}$■" superscript, and "A" have the same meaning as in Tables 1A and 1B above. EUS6 is the epoxidized product of Example 6 in U.S. Pat. No. 6,001,950 wherein the epoxy was made by substantially the same method as set forth in Example 11 herein.

TABLE 2A

| Ex | Mole Ratio | Mw/Mn | Phenol, % | TPE, % |
|---|---|---|---|---|
| 5 | 0.217 | 523/364 | 1.18 | 4.0 |
| 5A | 0.217 | ND | ND | ND |
| 6 | 0.25 | 574/383 | 1.18 | 1.5 |
| 6A | 0.25 | 603/393 | 0.30 | 3.14 |
| 7 | 0.19 | 528/363 | 0.51 | 3.8 |
| 7A | 0.19 | 553/373 | 0.34 | 1.9 |
| P | 0.17 | ND | ND | ND |
| 8 | 0.217 | 483/373 | 1.20 | 5.08 |
| 8A | 0.217 | 499/383 | 0.5 | 4.86 |
| 9$^{(a)}$ | 0.217 | 523/363 | 1.34 | 1.99 |
| 9A | 0.217 | 547/394 | 0.53 | 1.81 |
| 10 | 0.217 | 509/377 | 1.31 | 2.39 |
| 13 | 0.217 | 622/387 | 0.34 | 2.49 |
| 13A | 0.217 | 647/397 | 0.27 | 3.34 |

TABLE 2B

| Ex | C&P, cps (175° C.) | UV 350/365 nm | Fluorescence max, nm | Fluorescence % |
|---|---|---|---|---|
| 5 | 888 | 0.496/0.295 | 530 | 140 |
| 5A | 1243 | 0.465/0.274 | ND | ND |
| 6 | 1775 | 0.506/0.307 | 528 | 144 |
| 6A | 2024 | 0.560/0.337 | ND | ND |
| 7 | 1065 | 0.495/0.296 | ND | ND |
| 7A | 1065 | 0.559/0.331 | 528 | 152 |
| P | 720 | 0.544/0.300 | 528 | 100 |
| 8 | 923 | 0.505/0.299 | 530 | 132 |
| 8A | 1278 | 0.572/0.333 | 530 | 137 |
| 9$^{(a)}$ | 1278 | 0.534/0.320 | 526 | 145 |
| 9A | 1704 | 0.598/0.351 | 528 | 149 |
| 10 | 639 | 0.441/0.268 | ND | ND |
| 13 | 1775 | 0.480/0.300 | 530 | 161 |
| 13A | 2627 | 0.518/0.317 | ND | ND |
| 11 | 264* | 0.400/0.223 | 528 | 126 |
| EUS6 | 279* | 0.386/0.214 | 528 | 88,89 |
| EPON | ND | 0.273/0.161$^{(h)}$ | 528 | 57 |

$^{(a)}$none of the m-cresol was detected in the distillate or the product.

From the above Tables 2A and 2B it can be seen that:

(a) The fluorescence of the glyoxal-phenol condensate of Example 5 of this invention is about 40% higher than that of Example 7 in the 950 patent.

(b) The fluorescence of the condensate of Example 11 of this invention, which is the glycidylated product of Example 7 of this invention, is about 37% higher than the glycidyl epoxy prepared from the product of Example 6 of the 950 patent.

(c) The fluorescence of Example 11 of this invention is about 69% greater than the fluorescence of EPON 1031.

(d) The meta-cresol used in Example 9 was completely reacted and optical properties, both ultraviolet absorbtion and fluorescence, are essentially identical to that of the above Example 1 of this application and that the fluorescence in particular is significantly higher than that of the product of Example 7 in U.S. Pat. No. 6,001,950.

(e) The ultraviolet absorbance of the epoxy product of Example 11 in this invention is substantially greater than that of EPON 1031 but about the same as that of Example 6 of the 950 patent.

What is claimed is:

1. A glyoxal-phenolic condensate having a fluorescence which is at least 30% higher than that of Acridine Orange Base when measured as the maximum counts within the range of 450 nm to 650 nm at an excitation wavelength of 442 nm when the Acridine Orange Base is used at a concentration of 0.31 mg/liter in methanol and the condensate is used at a concentration of 0.05 weight percent in tetrahydrofuran, said condensate being that of glyoxal and a member selected from the group consisting of: (a) phenol; (b) a mixture of phenol and another monocyclic-monohydric phenolic monomer having from 7 to 9 carbon atoms wherein the another monomer makes up to about 20 mole % of the mixture; and (c) mixtures thereof.

2. The condensate of claim 1 wherein: the condensate is that of glyoxal and phenol; and the condensate contains not more than 2% of free phenol.

3. The condensate of claim 1 wherein: the condensate is that of glyoxal and a mixture of phenol and another monocyclic-monohydric phenolic monomer having from 7 to 9 carbon atoms wherein the another monomer makes up to about 20 mole % of the mixture; and the mixture contains not more than 2% of free phenol and said another monomer.

4. The condensate of claim 1 having a fluorescence which is at least 55% higher than that of Acridine Orange Base.

5. The condensate of claim 2 having a fluorescence which is at least 70% higher and contains not more than 1% of free phenol.

6. An epoxy resin having a fluorescence which is at least equal to that of Acridine Orange Base when measured as the maximum counts within the range of 450 nm to 650 nm at an excitation wavelength of 442 nm when the Acridine Orange Base is used at a concentration of 0.31 mg/liter in methanol and the resin is used at a concentration of 0.05 weight percent in tetrahydrofuran, wherein said epoxy resin is a member selected from the group consisting of: (a) a glycidylated condensate of glyoxal and phenol; (b) a glycidylated condensate of glyoxal with phenol admixed with another monocyclic-monohydric phenolic monomer having from 7 to 9 carbon atoms wherein the another monomer makes up to about 20 mole % of the mixture; (c) a reaction product of about 4 to 8 parts of a glycidyl epoxy resin and about one part of a glyoxal-phenolic condensate of glyoxal and phenol; (d) a reaction product of about 4 to 8 parts of a glycidyl epoxy resin and about 1 part of a condensate of glyoxal with phenol admixed with another monocyclic-monohydric phenolic monomer having from 7 to 9 carbon atoms wherein the another monomer makes up to about 20 mole % of the mixture; and (e) mixtures of the foregoing.

7. The epoxy resin of claim 6 wherein the resin is that of a glycidylated glyoxal-phenolic condensate.

8. The epoxy resin of claim 7 wherein the glycidylated glyoxal-phenolic condensate is that of the glycidylated condensate of glyoxal and phenol.

9. The epoxy resin of claim 6 wherein the glyoxal-phenolic condensate is that of a reaction product of about 4 to 8 parts of a glycidyl epoxy resin and about 1 part of a glyoxal-phenolic condensate which is mixture of phenol and another monocyclic-monohydric phenolic monomer having from 7 to 9 carbon atoms wherein the another monomer makes up to about 20 mole % of the mixture.

10. The resin of claim 6 having a fluorescence which is at least 30% higher than that of Acridine Orange Base.

11. A composition comprising:
 (a) 100 parts of an epoxy resin; and
 (b) about 1 to 35 parts based on the weight of the epoxy resin of a member selected from the group consisting of,
  (i) a glyoxal-phenolic condensate;
  (ii) a glycidylated glyoxal-phenolic condensate;
  (iii) a reaction product of about 4 to 8 parts of a glycidyl epoxy resin and about 1 part to a glyoxal-phenolic condensate; and
  (iv) mixtures thereof, all of said parts being by weight wherein each of the glycidylated glyoxal-phenolic condensate as well as the reaction product of about 4 to 8 parts of a glycidyl epoxy resin for each part of a glyoxal-phenolic condensate has a fluorescence which is at least equal to that of Acridine Orange Base and the glyoxal-phenolic condensate has a fluorescence which is at least 30% higher than Acridine Orange Base when measured as the maximum counts within the range of 450 nm and 650nm at an excitation wavelength of 442 nm and the Acridine Orange Base is used at a concentration of 0.31 mg/liter in methanol whereas each of the glyoxal-phenolic condensate, the glycidylated glyoxal phenolic condensate and the reaction product of about 4 to 8 parts of a glycidyl epoxy resin for each part of a glyoxal-phenolic condensate is used at a concentration of 0.05 weight percent in tetrahydrofuran.

12. The composition of claim 11 wherein the glycidylated glyoxal-phenolic condensate has a fluorescence which is at least 20% higher than that of Acridine Orange Base and the glyoxal-phenolic condensate has a fluorescence which is at least 55% higher than that of Acridine Orange Base.

13. The composition of claim 11 wherein each of the glycidylated glyoxal-phenolic condensate as well as the glyoxal-phenolic condensate is that of glyoxal and phenol.

14. The cured glycidylated glyoxal-phenolic condensate of claim 11.

15. A laminate of reinforcing fibers in a resinous matrix, said resinous matrix containing, for each 100 parts of an epoxy resin, from about 1 to 35 parts by weight of a member selected from the group consisting of a glycidylated glyoxal-phenolic condensate, the reaction product of about 4 to 8 parts of a glycidyl epoxy resin and about 1 part of a glyoxal-phenolic condensate, a glyoxal-phenolic condensate and mixtures thereof wherein said glycidylated glyoxal-phenolic condensate as well as the reaction product of about 4 to 8 parts of a glycidyl epoxy resin and about 1 part of a glyoxal-phenolic condensate have a fluorescence which is at least equal to Acridine Orange base and the glyoxal-phenolic condensate has a fluorescence which is at least 30% higher than Acridine Orange Base when the fluorescence is measured at the maximum counts at an excitation wavelength of 442 nm within the range of 450 and 650 nm at a concentration of the Acridine Orange Base of 0.31 mg/liter in methanol and the concentration of the condensate in each instance is 0.05 weight percent in tetrahydrofuran.

16. The laminate of claim 15 wherein the member is a glycidylated glyoxal-phenolic condensate.

17. The laminate of claim 15 wherein the member is a glyoxal-phenolic condensate wherein such condensate is that of glyoxal and phenol.

18. The laminate of claim 15 wherein the fluorescence of the glyoxal-phenolic condensate is at least 50% higher than that of Acridine Orange Base.

19. The glycidylated glyoxal-phenolic condensate of claim 15 which has a fluorescence of at least 20% higher than that of Acridine Orange Base.

20. A method for preparing a glyoxal-phenolic raw condensate which comprises:
 (a) adding glyoxal to phenol and oxalic acid wherein the phenol is at a temperature within the range of about 110° C. to about 140° C. and optionally wherein up to about 20 mole % of the phenol is replaced with another monocyclic-monohydric phenolic monomer having 7 to 9 carbon atoms, distilling water from the reaction mixture of phenol and glyoxal wherein the temperature of the reaction mixture formed by the addition of the glyoxal is in a range of about 110° C. to about 140° C., the mole ratio of glyoxal to the phenol together with any of the said another phenolic monomer is from about 0.15 to 0.25 moles of glyoxal for each mole of the phenol and any additional phenolic monomer, the quantity of the oxalic acid is from about 0.5% to about 4% based on the weight of the phenol and of the said another phenolic monomer; and
 (b) continuing the heating and distillation of water at the temperature of about 110° to 140° C. until at least 85% of the aldehyde equivalents of the glyoxal charged have reacted.

21. The method of claim 20 wherein: substantially all of the phenolic compound is phenol itself; the glyoxal added to the phenol is a solution of about 30% to about 60%, by weight, of glyoxal dissolved in water; and the said raw condensate is heated to a temperature of up to about 200° C., under vacuum, to prepare the glyoxal-phenol condensate by removing oxalic acid, water and free phenol while leaving up to about 5% or less of the free phenol in the condensate.

22. A method for making a glyoxal-phenolic condensate wherein from about 0.15 to about 0.27 moles of glyoxal are reacted with each mole of phenolic monomer and wherein a total quantity of from about 0.5% to about 4% by weight of oxalic acid as catalyst is charged to a reactor, the quantity of oxalic acid being based on the weight of phenolic monomer, said method comprising:
 (A) heating and distilling water under vacuum out of a mixture at a temperature of about 55° C. to about 90° C. wherein the mixture comprises glyoxal, phenol and at least 5% by weight of water and wherein the quantity of phenol is from about 5% to 20% by weight of the total phenolic monomer to be charged in the reaction;
 (B) continuing the heating and distillation of water from the mixture until the amount of water is from about 5% to 30% by weight of the mixture;
 (C) adding a quantity of from about 0.2% to about 1% of oxalic acid to the mixture to form a reaction mixture in a reactor, said quantity of oxalic acid based on the total quantity of phenolic monomer to be charged to the reactor, and heating the reaction mixture at a temperature of within the range of about 80° C. to 125° C. until from about 15% to about 40% of the aldehyde equivalents of the glyoxal charged to the mixture have reacted;
 (D) adding the remainder of the oxalic acid and phenol wherein optionally up to about 20 mole % of the total phenol to be charged to the reactor is replaced with another monocyclic and monohydric phenolic monomer, said monomer having from 7 to 9 carbon atoms, and heating the reaction mixture at a temperature in the range of about 105° C. to about 135° C. until at least 85% of the aldehyde equivalents of the glyoxal charged to the mixture have reacted; and (E) removing oxalic acid, water and phenolic monomer from the reaction mixture whereupon the condensate contains not more than 5% of free phenolic monomer.

23. A method for the manufacture of a phenolic-glyoxal condensate wherein the molar ratio of glyoxal to phenolic monomer is from about 0.15 to about 0.27 and a total of about 0.5% to about 4% of oxalic acid is used as catalyst, the quantity of catalyst based, by weight, on the total quantity of phenolic monomer to be charged to the reactor, and wherein said method comprises:

(A) forming a reaction mixture in a reactor by charging: (1) substantially all of the glyoxal to the reactor; (2) from about 5 percent to about 20 percent by weight of the total phenolic monomer to be charged to the reactor said monomer being phenol itself; (3) from about 0.2% to about 1% of catalyst based on the weight of phenolic monomer to be charged to the reactor; and wherein the reaction mixture contains from about 5% to about 30% by weight of water;

(B) heating a reaction mixture at a temperature within the range of about 80° C. to about 125° C. until from about 15% to 40% of the aldehyde equivalents have reacted;

(C) adding the remainder of the catalyst and phenolic monomer wherein such phenolic monomer is phenol and optionally up to 20 mole percent of the phenol, based on the total amount of phenolic monomer to be charged to the reactor, is replaced with another monocyclic and monohydric phenolic monomer wherein the such another phenolic monomer has from 7 to 9 carbon atoms; and (D) heating the reaction mixture at a temperature within the range of about 105° C. to 135° C. until at least 85% of the aldehyde equivalents have reacted; and (E) removing oxalic acid, water and phenolic monomer from the reaction mixture whereupon the condensate contains not more than 5% of free phenolic monomer.

* * * * *